United States Patent
Cheng et al.

(10) Patent No.: US 12,356,780 B2
(45) Date of Patent: Jul. 8, 2025

(54) DISPLAY DEVICE AND MANUFACTURING METHOD THEREOF

(71) Applicant: Au Optronics Corporation, Hsinchu (TW)

(72) Inventors: Shiuan-Tzung Cheng, Hsinchu (TW); Ching-Yao Shih, Hsinchu (TW); Cheng-Liang Wang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 619 days.

(21) Appl. No.: 17/519,557

(22) Filed: Nov. 4, 2021

(65) Prior Publication Data
US 2023/0064954 A1 Mar. 2, 2023

(30) Foreign Application Priority Data
Aug. 24, 2021 (TW) ................. 110131353

(51) Int. Cl.
*H10H 29/14* (2025.01)
*H10H 20/01* (2025.01)
*H10H 20/841* (2025.01)
*H10H 20/851* (2025.01)
*H10H 20/857* (2025.01)

(52) U.S. Cl.
CPC .......... *H10H 29/142* (2025.01); *H10H 20/01* (2025.01); *H10H 20/841* (2025.01); *H10H 20/851* (2025.01); *H10H 20/857* (2025.01); *H10H 20/034* (2025.01); *H10H 20/0361* (2025.01); *H10H 20/0364* (2025.01)

(58) Field of Classification Search
None
See application file for complete search history.

(56) References Cited

U.S. PATENT DOCUMENTS

| | | | |
|---|---|---|---|
| 7,732,236 B2 | 6/2010 | Nakahata et al. | |
| 8,362,521 B2 | 1/2013 | Nakahata et al. | |
| 2007/0164306 A1 | 7/2007 | Nakahata et al. | |
| 2010/0207138 A1 | 8/2010 | Nakahata et al. | |
| 2020/0411491 A1* | 12/2020 | Ahmed | H01L 33/502 |

FOREIGN PATENT DOCUMENTS

| | | |
|---|---|---|
| CN | 106920790 | 7/2017 |
| CN | 105720156 | 7/2018 |
| CN | 111048498 | 4/2020 |
| CN | 111211213 | 9/2020 |
| CN | 109449260 | 2/2021 |
| TW | 200610192 | 3/2006 |

OTHER PUBLICATIONS

CN 106920790A, Wang Gang et al, A Full Color Display Device and Preparation Method Thereof, Jul. 4, 2017 (Year: 2017).*
KR 20170006050A, Han Hong Gyu, Liquid Crystal Display Device, Jan. 17, 2017 (Year: 2017).*

* cited by examiner

*Primary Examiner* — Alexander G Ghyka
(74) *Attorney, Agent, or Firm* — JCIPRNET

(57) ABSTRACT

A display device includes a circuit substrate, a silicon dioxide pattern, and a plurality of light-emitting elements. The silicon dioxide pattern is located on the circuit substrate and has a plurality of openings. The light-emitting elements are located on the circuit substrate and are electrically connected to the circuit substrate. The light-emitting elements are located in the openings and are adjacent to the silicon dioxide pattern. A manufacturing method of a display device is also provided.

20 Claims, 11 Drawing Sheets

DISPLAY DEVICE AND MANUFACTURING METHOD THEREOF

CROSS-REFERENCE TO RELATED APPLICATION

This application claims the priority benefit of Taiwan application serial no. 110131353, filed on Aug. 24, 2021. The entirety of the above-mentioned patent application is hereby incorporated by reference herein and made a part of this specification.

BACKGROUND

Technical Field

The disclosure relates to a display device and a manufacturing method thereof, and in particular, relates to a display device providing improved display quality and a manufacturing method thereof.

Description of Related Art

Due to the excessively small size of micro light-emitting diodes (micro LEDs) and the different LED pitches required by micro LED display devices, at present, mass transfer is adopted to manufacture micro LED display devices. That is, the micro-electromechanical array technology is used to pick and place LED dies, so as to transport a large number of LED dies to a circuit substrate with pixel circuits and at the same time to adjust the pitches of the dies.

However, due to the insufficient supporting force of the transfer carrier, the number of dies that can be transferred in a single transfer is limited. At present, the micro LED dies required by the display devices may be arranged through the multi-block transfer and splicing method only, uneven brightness (mura) caused by splicing thus occurs, and poor display quality is provided.

SUMMARY

The disclosure provides a display device providing improved display quality.

An embodiment of the disclosure provides a display device including a circuit substrate, a silicon dioxide pattern, and a plurality of light-emitting elements. The silicon dioxide pattern is located on the circuit substrate and has a plurality of openings. The light-emitting elements are located on the circuit substrate and are electrically connected to the circuit substrate. The light-emitting elements are located in the openings and are adjacent to the silicon dioxide pattern.

In an embodiment of the disclosure, the display device further includes a release layer, and the silicon dioxide pattern and the light-emitting elements are located between the circuit substrate and the release layer.

In an embodiment of the disclosure, the display device further includes an isolation structure, and the release layer is located between the isolation structure and the silicon dioxide pattern.

In an embodiment of the disclosure, the display device further includes a color conversion structure located between the isolation structure.

In an embodiment of the disclosure, an area of a top surface and an area of a bottom surface of each of the light-emitting elements are different.

In an embodiment of the disclosure, the circuit substrate has a plurality of recesses, and the silicon dioxide pattern is located in the recesses.

In an embodiment of the disclosure, the display device further includes a light absorption pattern, and the silicon dioxide pattern covers the light absorption pattern.

In an embodiment of the disclosure, the display device further includes a reflective pattern, and the silicon dioxide pattern covers the reflective pattern.

In an embodiment of the disclosure, a width of the reflective pattern close to the release layer side is less than the width of the reflective pattern away from the release layer side.

An embodiment of the disclosure further provides a manufacturing method of a display device, and the manufacturing method includes the following steps. A growth substrate is provided. A release layer is formed on the growth substrate. A silicon dioxide pattern is formed on the release layer, and the silicon dioxide pattern has a plurality of first openings. A plurality of light-emitting elements are formed on the release layer, and the light-emitting elements are located in the first openings.

In an embodiment of the disclosure, the manufacturing method of the display device further includes the following steps. A circuit substrate is provided, and the light-emitting elements and the circuit substrate are set to be electrically connected.

In an embodiment of the disclosure, the manufacturing method of the display device further includes the following step. The growth substrate is removed to expose the release layer.

In an embodiment of the disclosure, the manufacturing method of the display device further includes the following step. An isolation structure is formed on the release layer.

In an embodiment of the disclosure, the manufacturing method of the display device further includes the following step. A color conversion structure is formed between the isolation structure.

In an embodiment of the disclosure, the step of forming the silicon dioxide pattern on the release layer further includes the following steps. A light absorption pattern is formed on the release layer, and the light absorption pattern has a plurality of second openings. The silicon dioxide pattern is formed to cover the light absorption pattern.

In an embodiment of the disclosure, the step of forming the silicon dioxide pattern on the release layer further includes the following steps. A reflective pattern is formed on the release layer, and the reflective pattern has a plurality of third openings. The silicon dioxide pattern is formed to cover the reflective pattern.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
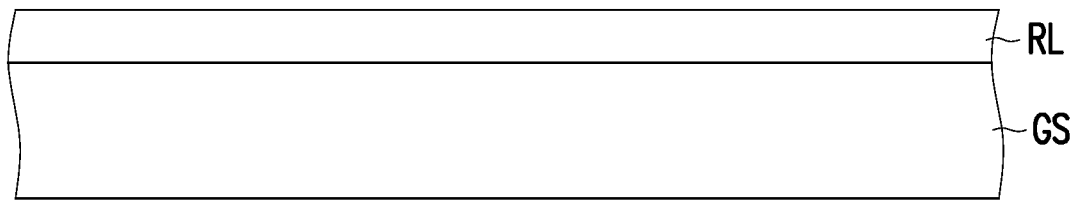
FIG. 1A to FIG. 1L are cross-sectional schematic views of a step process of a manufacturing method of a display device 10 according to an embodiment of the disclosure.

In the accompanying drawings, thicknesses of layers, films, panels, regions, and so on are exaggerated for clarity. Throughout the specification, the same reference numerals in the accompanying drawings denote the same elements. It should be understood that when an element such as a layer, film, region or substrate is referred to as being "on" or "connected to" another element, it means that the element is directly on or connected to the another element, or an intervening element may be provided therebetween. In contrast, when an element is referred to as being "directly on" or "directly connected to" another element, it means that no intervening element is provided therebetween. As used herein, the term "connected" may refer to physical connection and/or electrical connection. Further, the "electrical connection" or "coupling" may be that other elements are provided between two elements.

It should be understood that, although the terms "first", "second", "third", etc., may be used herein to describe various elements, components, regions, layers and/or portions, these elements, components, regions, layers, and/or portions should not be limited by these terms. These terms are used to distinguish one element, component, region, layer, or portion from another element, component, region, layer, or portion. Therefore, the first "element", "component", "region", "layer", or "portion" discussed below may be referred to as the second element, component, region, layer, or portion without departing from the teachings of the specification.

Moreover, relative terms such as "below" or "bottom" and "above" or "top" may serve to describe the relation between one element and another element in the specification as shown in the drawings. It should also be understood that the relative terms are intended to include different orientations of a device in addition to the orientation shown in the drawings. For example, if a device in the drawings is flipped, an element originally described as being disposed "below" other elements shall be orientated to be "above" other elements. Therefore, the exemplary term "below" may cover the orientations of "below" and "above", depending on the specific orientation of the drawings. Similarly, if a device in the drawing is flipped over, an element originally described to be located "below" or "underneath" other elements is oriented to be located "on" the other elements. Therefore, the exemplary term "below" or "underneath" may include orientations of "above" and "below".

Exemplary embodiments are described herein with reference to the cross-sectional schematic views illustrating idealized embodiments. Therefore, variations of shapes resulting from the manufacturing technologies and/or tolerances, for example, are to be expected. Therefore, the embodiments described herein should not be construed as being limited to the particular shapes of regions as illustrated herein but are to include deviations in shapes that result from manufacturing, for example. For instance, regions shown or described as being flat may typically have rough and/or non-linear features. Besides, the acute angle as shown may be round. Therefore, the regions shown in the drawings are schematic in nature, and their shapes are not intended to show the exact shape of the regions, and are not intended to limit the scope of the claims.

FIG. 1A to FIG. 1L are cross-sectional schematic views of a step process of a manufacturing method of a display device 10 according to an embodiment of the disclosure. First, with reference to FIG. 1A, a growth substrate GS is provided. In this embodiment, the growth substrate GS may be a gallium arsenide (GaAs) substrate, a gallium phosphide (GaP) substrate, an indium phosphide (InP) substrate, a sapphire substrate, a silicon carbide (SiC) substrate, a gallium nitride (GaN) substrate, or other growth substrates suitable for an epitaxial process, but is not limited thereto.

Next, a release layer RL is formed on a surface of the growth substrate GS. The release layer RL may be used to facilitate removal of the growth substrate GS subsequently and may also be used to facilitate the subsequent epitaxial process. In this embodiment, a material of the release layer RL may be aluminum nitride (AlN), but is not limited thereto.

Figure 1B:
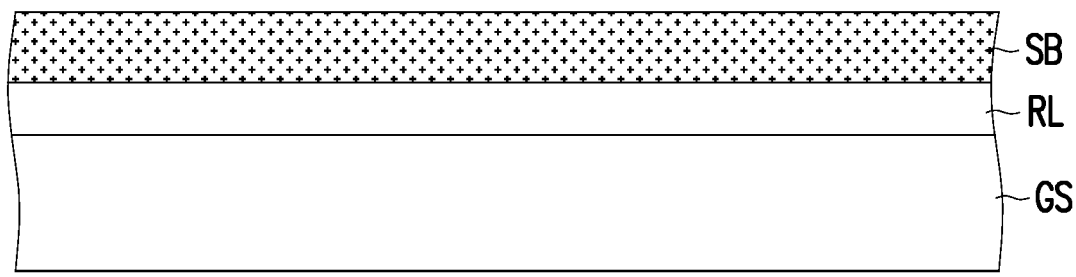

Next, with reference to FIG. 1B, a blanket-covered silicon dioxide layer SB is formed on the release layer RL. Next, with reference to FIG. 1C, a blanket-covered photoresist layer R1 is formed on the silicon dioxide layer SB. Next, with reference to FIG. 1D, the photoresist layer R1 is patterned to form a photoresist pattern R1P. Next, with reference to FIG. 1E, the silicon dioxide layer SB not covered by the photoresist pattern R1P is removed to form a silicon dioxide pattern SP, and the silicon dioxide pattern SP has a plurality of openings O1. From the above steps, it can be seen that the steps provided in FIG. 1B to FIG. 1E are performed to form the silicon dioxide pattern SP with the openings O1 on the release layer RL, and one or more of a thin film deposition process, a lithography process, and an etching process may be applied as needed.

Figure 1C:
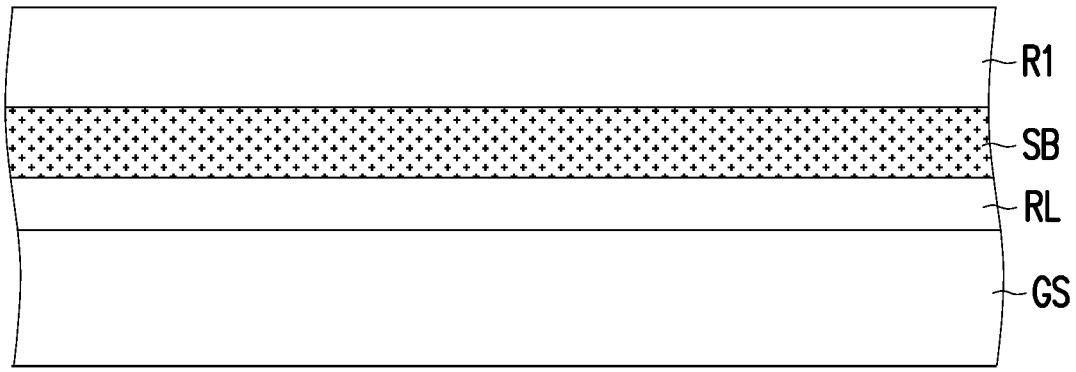
Figure 1D:
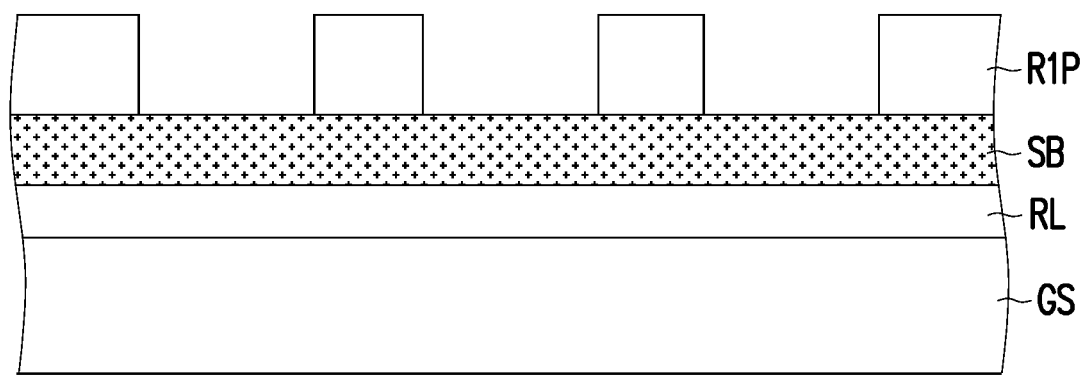
Figure 1E:
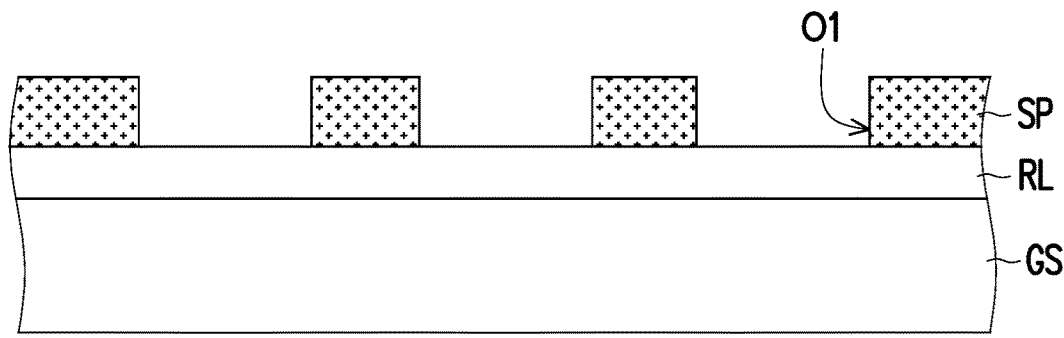
Figure 1F:
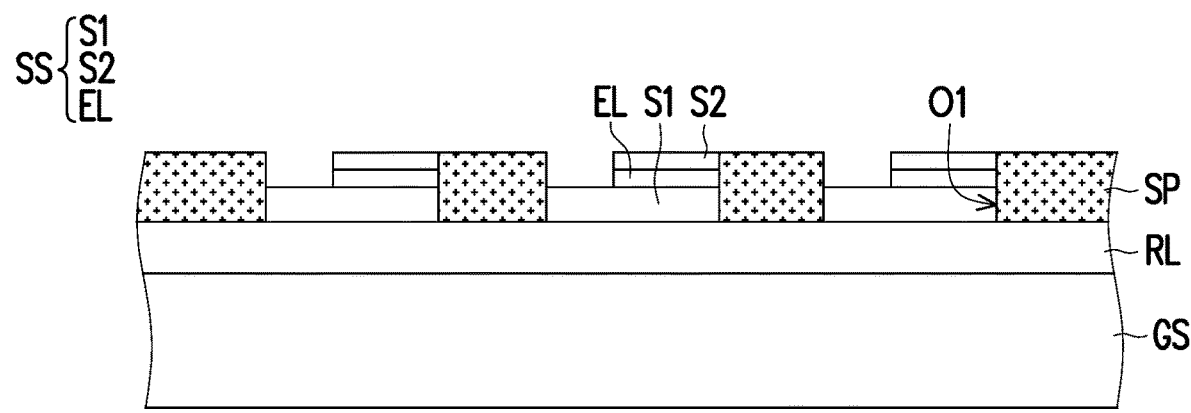

Next, with reference to FIG. 1F, a semiconductor stacked layer SS of a light-emitting element is formed in the openings O1 of the silicon dioxide pattern SP, and the semiconductor stacked layer SS may be formed on the release layer RL through an epitaxial process, a lithography process, and an etching process. Due to lattice matching, a semiconductor material used to form the semiconductor stacked layer SS may not grow on the silicon dioxide pattern SP. Therefore, the openings O1 of the silicon dioxide pattern SP may be configured to predefine a position of the semiconductor stacked layer SS, and a pitch between the openings O1 may be configured to define a pitch between the semiconductor stacked layer SS.

In this embodiment, the semiconductor stacked layer SS may include a first-type semiconductor layer S1, a second-type semiconductor layer S2, and a light-emitting layer EL sandwiched between the first-type semiconductor layer S1 and the second-type semiconductor layer S2. One of the first-type semiconductor layer S1 and the second-type semiconductor layer S2 may be an N-type doped semiconductor, and the other may be a P-type doped semiconductor. Besides, the first-type semiconductor layer S1 and the second-type semiconductor layer S2 may include a II-VI group material (e.g., zinc selenium (ZnSe)), III-V nitrogen compound material (e.g., gallium nitride (GaN), gallium arsenide, indium nitride (InN), indium gallium nitride (InGaN), aluminum gallium nitride (AlGaN), aluminum indium gallium nitride (AlInGaN)), or aluminum gallium indium phosphide (AlGaInP). For instance, in this embodiment, the first-type semiconductor layer S1 is, for example, an N-type doped semiconductor layer, and a material of the N-type doped semiconductor layer is, for example, N-type gallium nitride (n-GaN). The second-type semiconductor layer S2 is, for example, a P-type doped semiconductor layer, and a material of the P-type doped semiconductor layer is, for example, P-type gallium nitride (n-GaN), which should however not be construed as a limitation in the disclosure. In addition, a structure of the light-emitting layer EL is, for example, a multiple quantum well (MQW) structure. The multiple quantum well structure may include a plurality of layers of indium gallium nitride (InGaN) and a plurality of layers of gallium nitride (GaN) stacked in an alternating manner. By designing the proportion of indium or gallium in the light-emitting layer EL, a light-emitting wavelength range of the light-emitting layer may also be adjusted, which should however not be construed as a limitation in the disclosure.

Figure 1G:
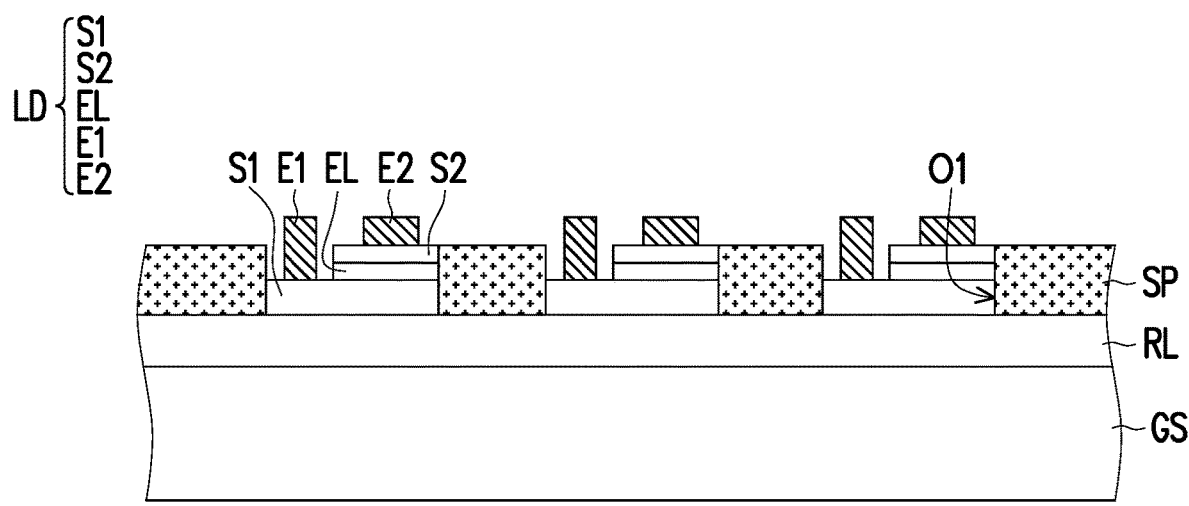

Next, with reference to FIG. 1G, an electrode E1 and an electrode E2 of a light-emitting element LD are formed. The electrode E1 is electrically connected to the first-type semiconductor layer S1, and the electrode E2 is electrically connected to the second-type semiconductor layer S2. The manufacturing of the light-emitting element LD is completed so far, and the light-emitting element LD includes the first-type semiconductor layer S1, the second-type semiconductor layer S1, the light-emitting layer EL, and the electrodes E1 and E2. Next, if necessary, a required number of light-emitting element LD and the growth substrate GS thereon are cut, or the growth substrate GS of a required size or shape and the light-emitting element LD thereon are cut to perform a mass transfer process.

Figure 1H:
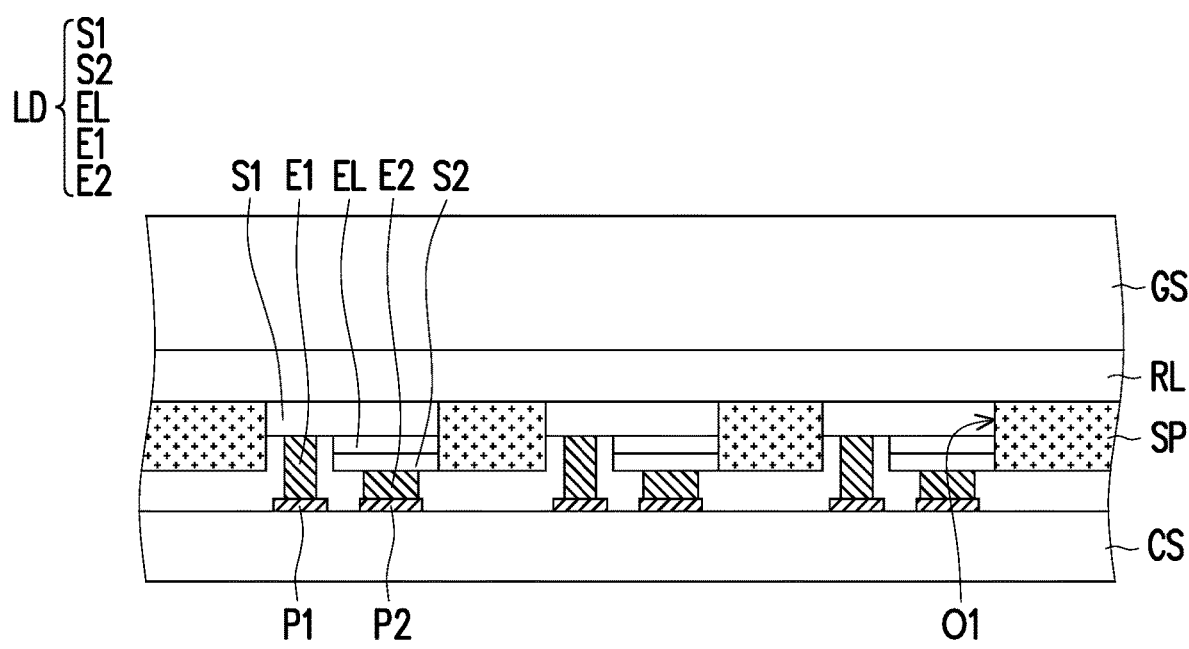

With reference to FIG. 1H, in some embodiments, a circuit substrate CS may further be provided, and the light-emitting element LD is transferred to the circuit substrate CS. The circuit substrate CS may be a rigid substrate or a flexible substrate, and the circuit substrate CS may include an element or a circuit required by the display device, such as a driving element, a switch element, a storage capacitor, a power line, a driving signal line, a timing signal line, a current compensation line, a detection signal line, and so on.

The circuit substrate CS may include a plurality of pads P1 and P2 arranged in an array on a surface thereof. During the mass transfer process, the growth substrate GS may be turned upside down, and the electrodes E1 and E2 of the light-emitting element LD are aligned with the pads P1 and P2, respectively. Next, the circuit substrate CS and the growth substrate GS are pressed together, and in this way, the electrode E1 is electrically connected to the pad P1, and the electrode E2 is electrically connected to the pad P2. In some embodiments, the electrode E1 and the pad P1 and the electrode E2 and the pad P2 may be electrically connected by solder, conductive glue, or other conductive materials.

Figure 1I:
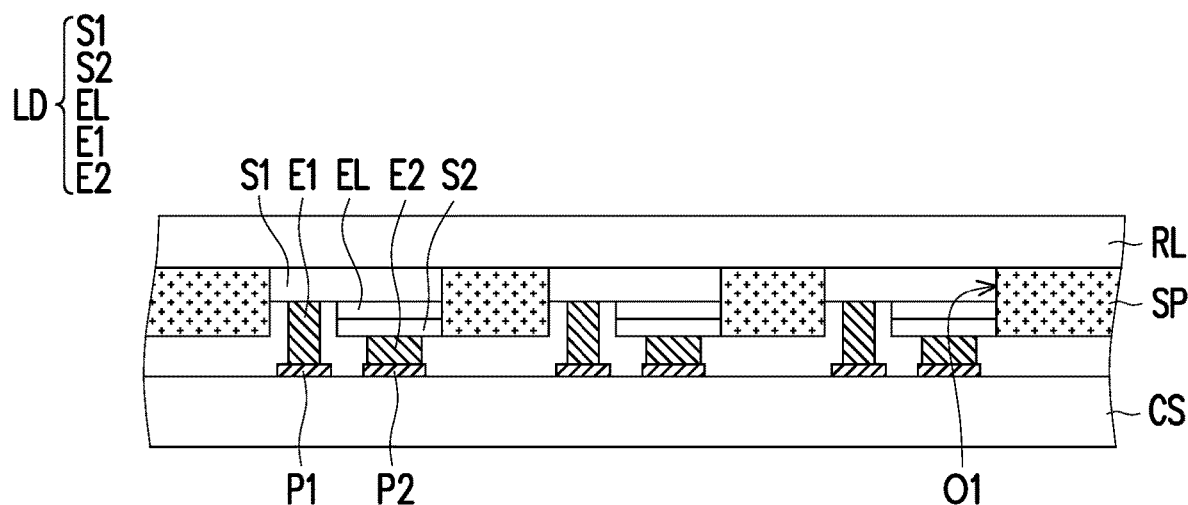

Next, with reference to FIG. 1I, in some embodiments, the growth substrate GS may be removed to expose the release layer RL. A laser lift off process, polishing, or other suitable methods may be applied to remove the growth substrate GS. For instance, an argon fluoride (ArF) excimer laser pulse with a wavelength of 193 nm may be focused on an interface between the growth substrate GS and the release layer RL, so that a material of the release layer RL is decomposed and separated from the growth substrate GS. Due to the presence of the release layer RL, the growth substrate GS does not contact the two material interfaces of the silicon dioxide pattern SP and the semiconductor stacked layer SS at the same time, and therefore, the removal of the growth substrate GS may be easily performed.

Figure 1J:
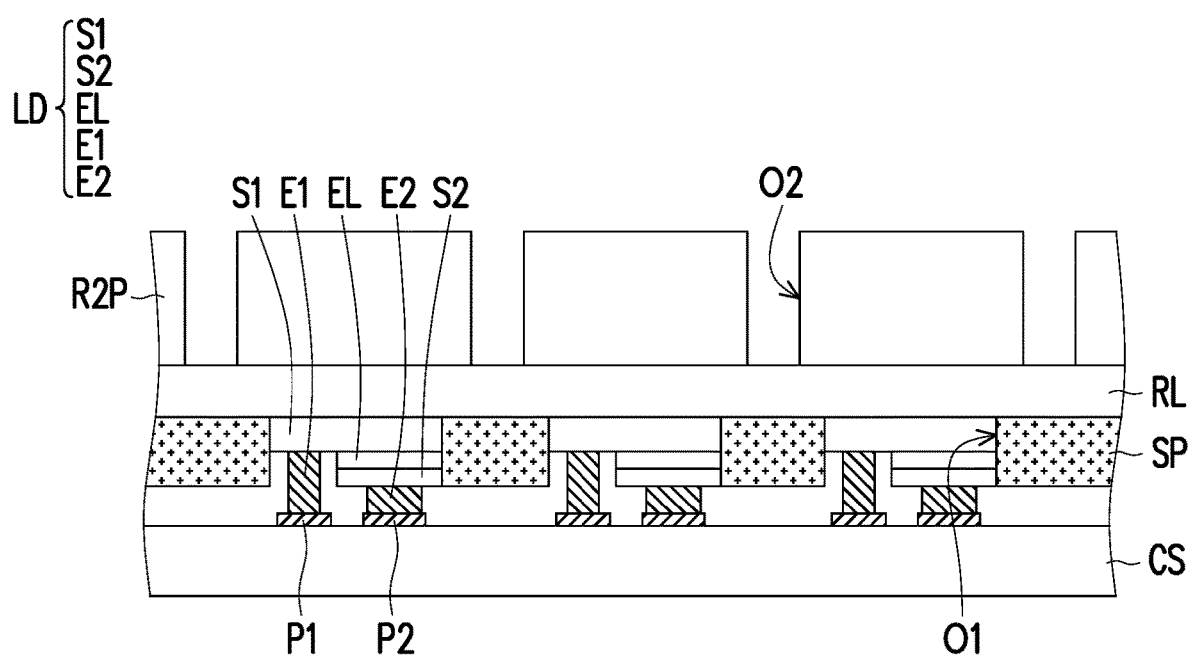
Figure 1K:
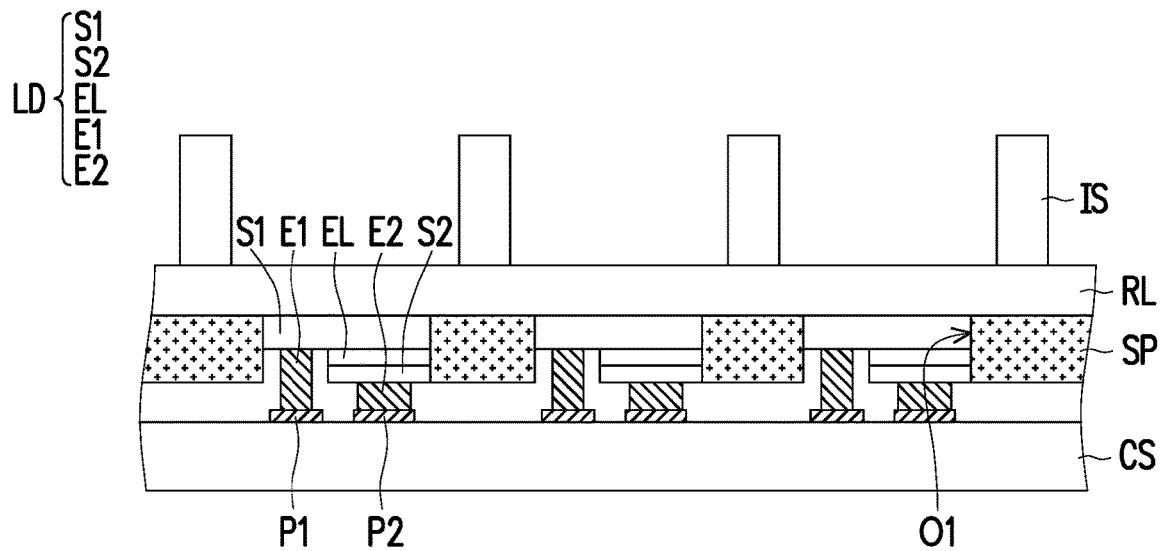

Next, with reference to FIG. 1J, in some embodiments, a photoresist pattern R2P having a plurality of openings O2 may be formed on the release layer RL in a manner similar to that provided in FIG. 1C to FIG. 1D. Next, with reference to FIG. 1K, in some embodiments, an isolation structure IS may be formed in the openings O2 of the photoresist pattern R2P before the photoresist pattern R2P is removed, and the isolation structure IS is then formed on the release layer RL.

Figure 1L:
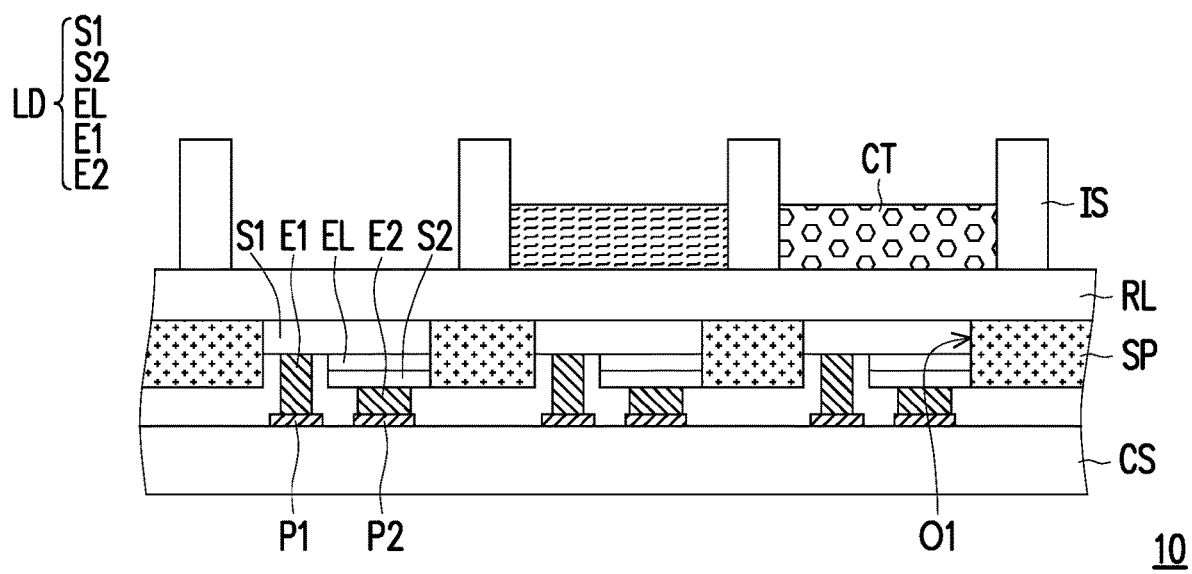

Next, with reference to FIG. 1L, in some embodiments, a color conversion structure CT may also be formed on the release layer RL, and the color conversion structure CT may be located between the isolation structure IS. The color conversion structure CT may include a wavelength conversion material with properties similar to that of phosphors or quantum dots, etc., and the light emitted by the light-emitting element LD may be converted into light of different colors through the color conversion structure CT to achieve a full-color display effect. For instance, the two adjacent color conversion structures CT shown in FIG. 1L may have different wavelength conversion materials. When the light-emitting elements LD are both blue light-emitting diodes, one of the color conversion structure CT may convert the blue light emitted by the light-emitting elements LD into red light, and the other color conversion structure CT may convert the blue light emitted by the light-emitting element LD into green light. In this way, the three light-emitting elements LD shown in FIG. 1L may constitute one pixel of the display device 10.

In the display device 10 shown in FIG. 1L, the display device 10 may include: the circuit substrate CS, the silicon dioxide pattern SP, and a plurality of light-emitting elements LD. The silicon dioxide pattern SP is located on the circuit substrate CS and has the openings O1. The light-emitting elements LD are located on the circuit substrate CS and are electrically connected to the circuit substrate CS. The light-emitting elements LD are located in the openings O1 and are adjacent to the silicon dioxide pattern SP.

In some embodiments, the display device 10 may further include the release layer RL, and the silicon dioxide pattern SP and the light-emitting element LD may be located between the circuit substrate CS and the release layer RL.

In some embodiments, the display device 10 may further include the isolation structure IS, and the release layer RL may be located between the isolation structure IS and the silicon dioxide pattern SP.

In some embodiments, the display device 10 may further include the color conversion structure CT, and the color conversion structure CT may be located between the isolation structure IS.

Hereinafter, the description of other embodiments of the disclosure will be continued with reference to FIG. 2 to FIG. 5. Moreover, it should be noted that the reference numerals and related content in the embodiments of FIG. 1A to FIG. 1L are also used, in which the same reference numerals are used to represent identical or similar elements, and descriptions of the same technical contents are omitted. Please refer to the descriptions of the embodiments of FIG. 1A to FIG. 1L for the omitted contents, which will not be repeated hereinafter.

Figure 2:
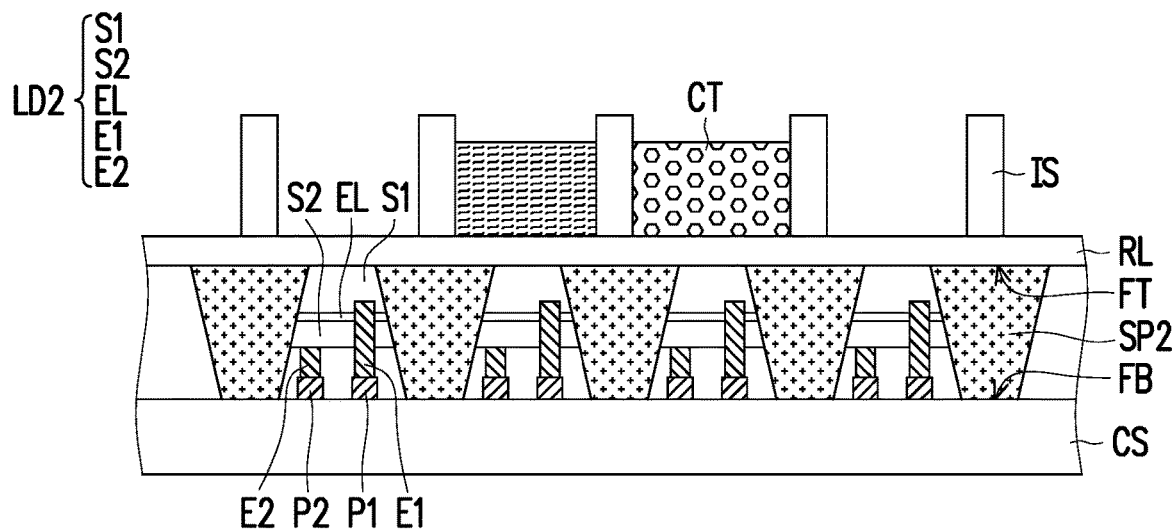
FIG. 2 is a cross-sectional schematic view of a display device 20 according to an embodiment of the disclosure.

FIG. 2 is a cross-sectional schematic view of a display device 20 according to an embodiment of the disclosure. The difference between the display device 10 shown in FIG. 1L and the display device 20 shown in FIG. 2 lies in that: In the display device 20, an area of a top surface and an area of a bottom surface of a light-emitting element LD2 are different. For instance, in this embodiment, a silicon dioxide pattern SP2 may have a top surface FT and a bottom surface FB, and the area of the top surface FT may be greater than the area of the bottom surface FB. Therefore, in the light-emitting element LD2 between the silicon dioxide pattern SP2, a width of the first-type semiconductor layer S1 may be less than a width of the second-type semiconductor layer S2, so that the light-emitting layer EL closer to the second-type semiconductor layer S2 may have a larger light-emitting area.

Figure 3:
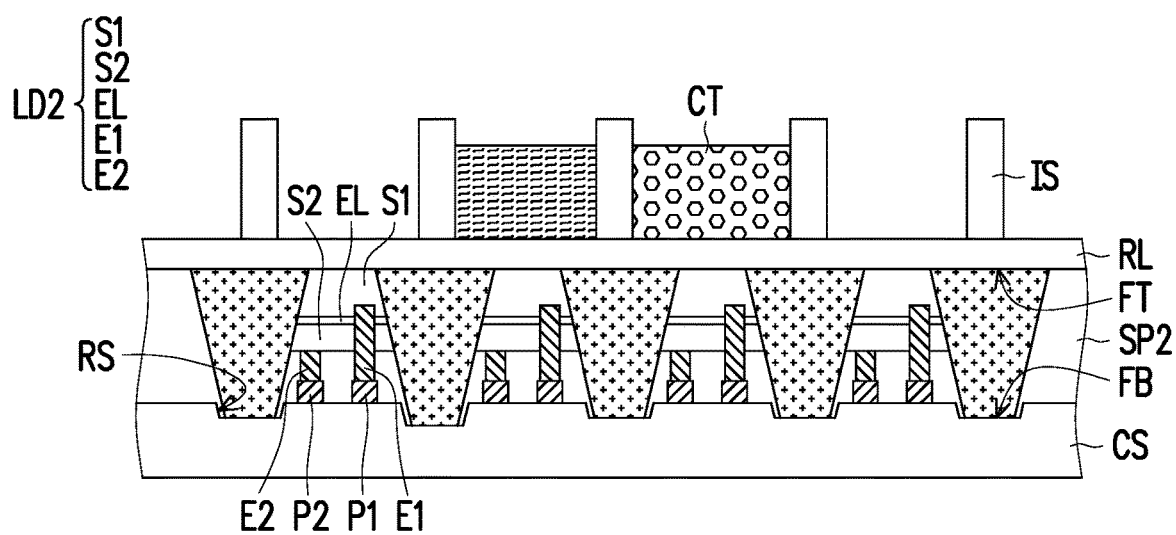
FIG. 3 is a cross-sectional schematic view of a display device 30 according to an embodiment of the disclosure.

FIG. 3 is a cross-sectional schematic view of a display device 30 according to an embodiment of the disclosure. The difference between the display device 20 shown in FIG. 2 and the display device 30 shown in FIG. 3 lies in that: the circuit substrate CS of the display device 30 may further include a plurality of recesses RS.

For instance, in this embodiment, the recesses RS may be located on the surface of the circuit substrate CS. Further, positions of the recesses and the pads P1 and P2 on the circuit substrate CS may be arranged in an alternating manner, so that the bottom surface FB of the silicon dioxide pattern SP2 may be located in the recesses RS. In this way, in the step of pressing together the circuit substrate CS and the growth substrate GS to allow the electrodes E1 and E2 to be electrically connected to the pads P1 and P2 respectively, position shifting caused by the pressing force may be prevented from occurring, and alignment accuracy is thereby improved.

Figure 4A:
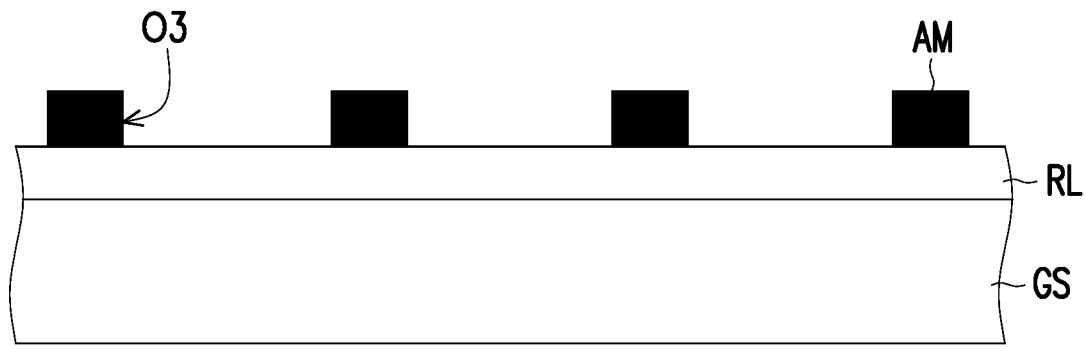
FIG. 4A to FIG. 4D are cross-sectional schematic views of a step process of a manufacturing method of a display device 40 according to an embodiment of the disclosure.
Figure 4B:
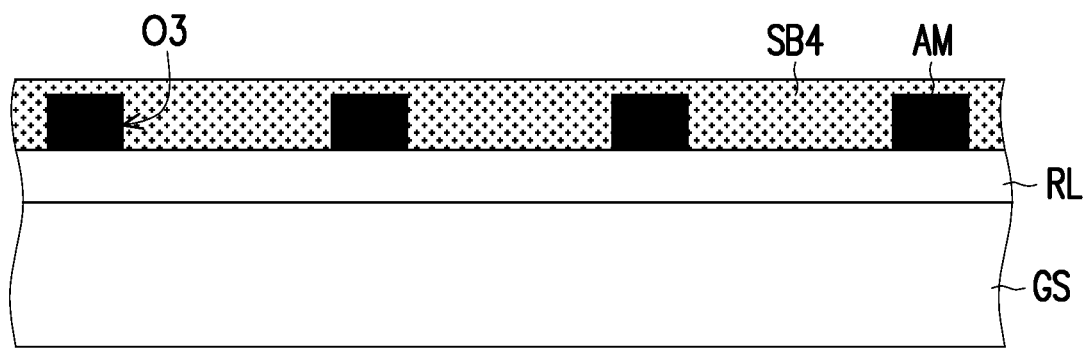
Figure 4C:
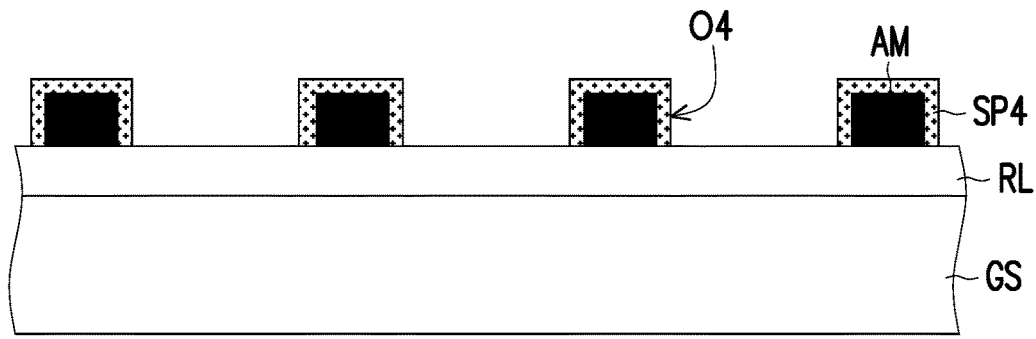
Figure 4D:
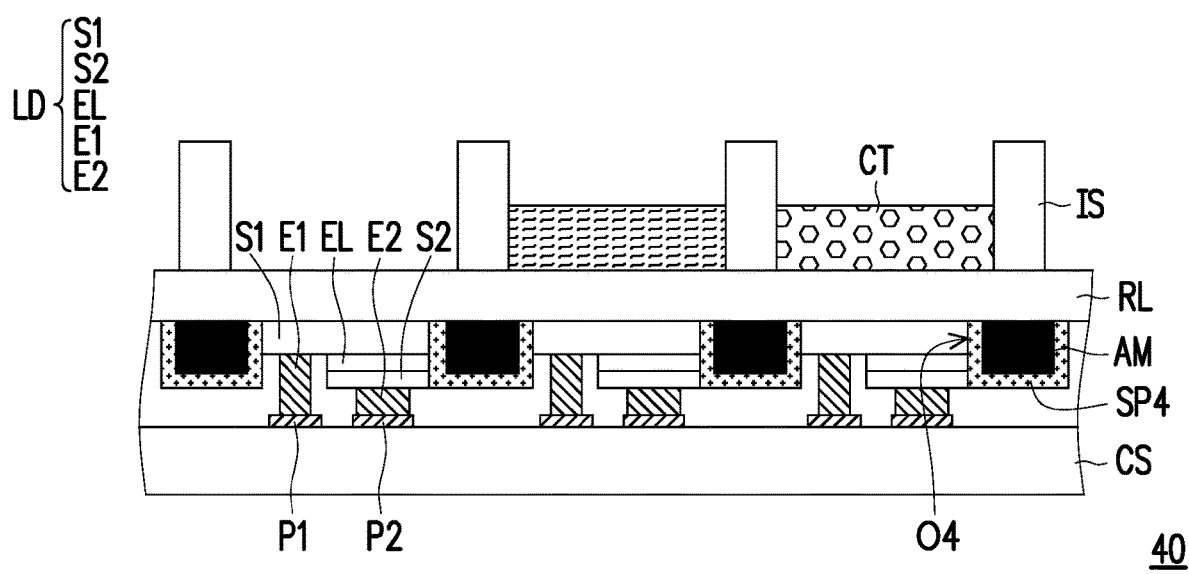

FIG. 4A to FIG. 4D are cross-sectional schematic views of a step process of a manufacturing method of a display device 40 according to an embodiment of the disclosure. The difference between the manufacturing method of the display device 10 shown in FIG. 1A to FIG. 1L and the manufacturing method of the display device 40 shown in FIG. 4 lies in that: the steps shown in FIG. 1B to FIG. 1E are replaced with the steps shown in FIG. 4A to FIG. 4C. That is, a silicon dioxide pattern SP4 is formed in a different manner, and then the display device 40 shown in FIG. 4D is manufactured.

The steps shown in FIG. 4A to FIG. 4C are described as follows. With reference to FIG. 4A, in this embodiment, a light absorption pattern AM may be formed on the growth substrate GS and the release layer RL shown in FIG. 1A, and the light absorption pattern AM has a plurality of openings O3. In some embodiments, a material of the light absorption pattern AM may include a material capable of absorbing visible light, such as black resin, a polyimide-based photoresist, an acrylic-based photoresist, etc.

Next, with reference to FIG. 4B, a blanket-covered silicon dioxide layer SB4 is formed on the release layer RL and the light absorption pattern AM, so that the silicon dioxide layer SB4 covers the light absorption pattern AM and fills the openings O3. Next, with reference to FIG. 4C, most of the silicon dioxide layer SB4 in the openings O3 is removed, leaving only the silicon dioxide pattern SP4 covering the light absorption pattern AM, so that the silicon dioxide pattern SP4 has a plurality of openings O4. The steps shown in FIG. 1F to FIG. 1L may be performed next to obtain the display device 40 shown in FIG. 4D.

In this embodiment, the display device 40 may include the circuit substrate CS, the silicon dioxide pattern SP4, a plurality of light-emitting elements LD, the release layer RL, the isolation structure IS, and the color conversion structure CT. The silicon dioxide pattern SP4 is located on the circuit substrate CS and has the openings O4. The light-emitting elements LD are located on the circuit substrate CS and are electrically connected to the circuit substrate CS. The light-emitting elements LD are located in the openings O4 and are adjacent to the silicon dioxide pattern SP4. Regarding the release layer RL, the silicon dioxide pattern SP4 and the light-emitting elements LD may be located between the circuit substrate CS and the release layer RL. Regarding the isolation structure IS, the release layer RL may be located between the isolation structure IS and the silicon dioxide pattern SP4. The color conversion structure CT is located between the isolation structure IS.

The difference between the display device 10 shown in FIG. 1L and the display device 40 shown in FIG. 4D lies in that: the display device 40 further includes the light absorption pattern AM. The silicon dioxide pattern SP4 may cover the light absorption pattern AM, and the light absorption pattern AM can absorb lateral light emitted from the light-emitting elements LD to prevent cocktail light and crosstalk from generating between the light emitting elements LD and to prevent the halo effect from occurring.

FIG. 5A to FIG. 5D are cross-sectional schematic views of a step process of a manufacturing method of a display device 50 according to an embodiment of the disclosure. The difference between the manufacturing method of the display device 40 shown in FIG. 4A to FIG. 4D and the manufacturing method of the display device 50 shown in FIG. 5A to FIG. 5D lies in that: the light absorption pattern AM is replaced by a reflective pattern RM.

Figure 5A:
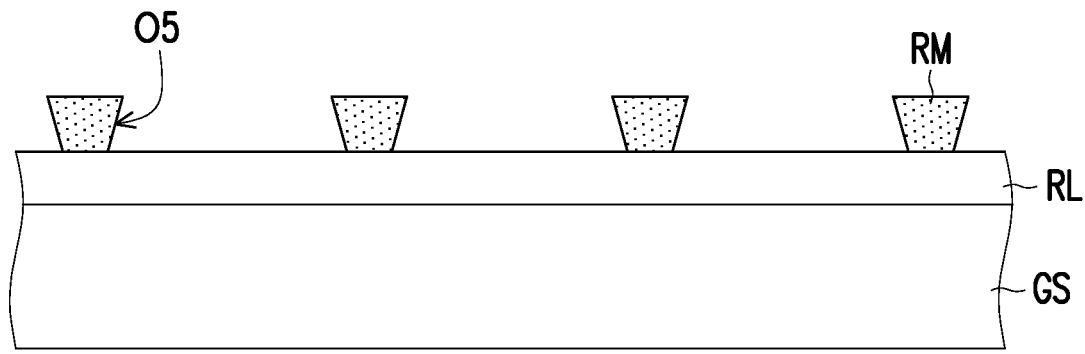
FIG. 5A to FIG. 5D are cross-sectional schematic views of a step process of a manufacturing method of a display device 50 according to an embodiment of the disclosure.

With reference to FIG. 5A, in this embodiment, the reflective pattern RM may be formed on the growth substrate GS and the release layer RL shown in FIG. 1A. A width of the reflective pattern RM close to the release layer RL side is less than the width of the reflective pattern RM away from the release layer RL side, and the reflective pattern RM has a plurality of openings O5. In some embodiments, a material of the reflective pattern RM may include a material with high reflectivity such as aluminum (Al) or silver (Ag).

Figure 5B:
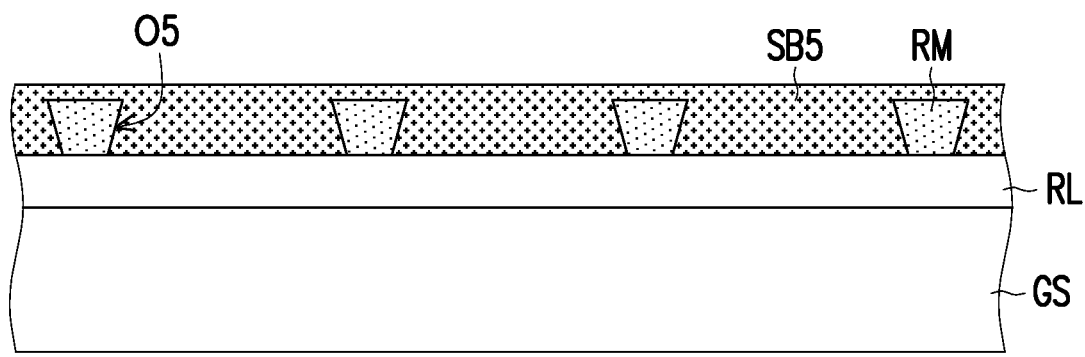
Figure 5C:
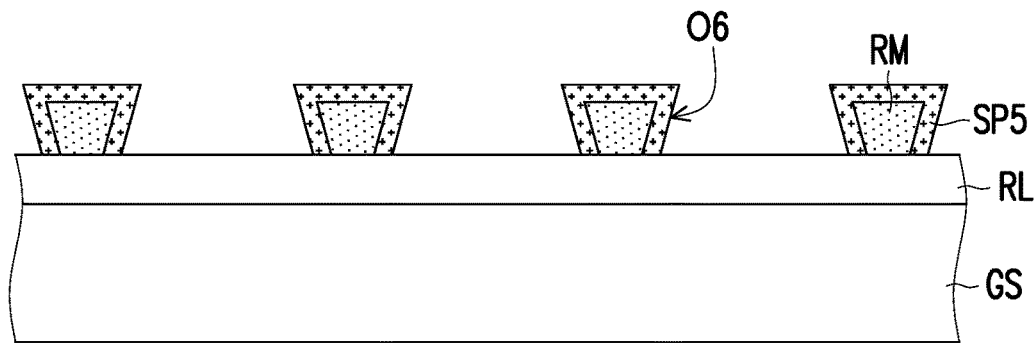

Next, with reference to FIG. 5B, a blanket-covered silicon dioxide layer SB5 is formed on the release layer RL and the reflective pattern RM, so that the silicon dioxide layer SB5 covers the reflective pattern RM and fills the openings O5. Next, with reference to FIG. 5C, most of the silicon dioxide layer SB5 in the openings O5 is removed, leaving only the silicon dioxide pattern SP5 covering the reflective pattern RM, so that the silicon dioxide pattern SP5 has a plurality of openings O6. The steps shown in FIG. 1F to FIG. 1L may be performed next to obtain the display device 50 shown in FIG. 5D.

In this embodiment, the display device 50 may include the circuit substrate CS, the silicon dioxide pattern SP5, a plurality of light-emitting elements LD, the release layer RL, the isolation structure IS, and the color conversion structure CT. The silicon dioxide pattern SP5 is located on the circuit substrate CS and has the openings O6. The light-emitting elements LD are located on the circuit substrate CS and are electrically connected to the circuit substrate CS. The light-emitting elements LD are located in the openings O6 and are adjacent to the silicon dioxide pattern SP5. Regarding the release layer RL, the silicon dioxide pattern SP5 and the light-emitting elements LD may be located between the circuit substrate CS and the release layer RL. Regarding the isolation structure IS, the release layer RL may be located between the isolation structure IS and the silicon dioxide pattern SP5. The color conversion structure CT is located between the isolation structure IS.

Figure 5D:
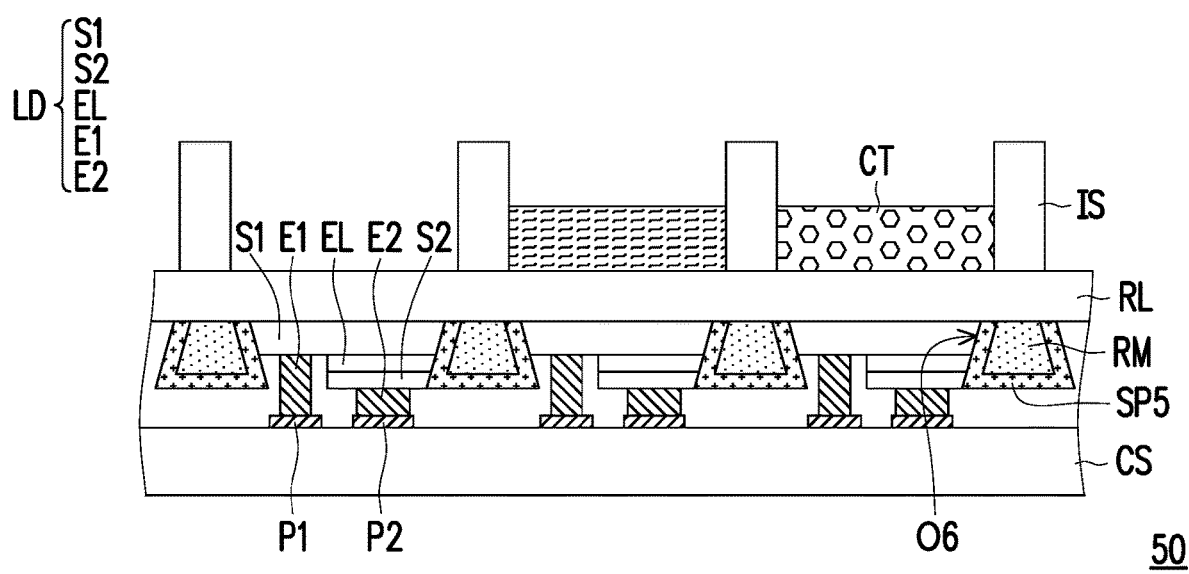

The difference between the display device 40 shown in FIG. 4D and the display device 50 shown in FIG. 5D lies in that: the display device 50 may further include the reflective pattern RM. The silicon dioxide pattern SP5 may cover the reflective pattern RM, and the silicon dioxide pattern SP5 may have a cross-sectional profile with a narrow top and a wide bottom. In this way, the side profile of the reflective pattern RM may locally change a light-emitting angle of the light-emitting elements LD and direct the light emitted by the light-emitting elements LD more directly above, such that the light output efficiency of the display device 50 is improved, and cocktail light and crosstalk are reduced.

In view of the foregoing, in the display device provided by the disclosure, the silicon dioxide pattern is used to define the position and pitch of the light-emitting elements. Therefore, the light-emitting elements of the required size, pitch, and number may be formed as needed. Further, in the display device provided by the disclosure, the release layer is arranged to be disposed between the light-emitting elements and the silicon dioxide pattern and the growth substrate. The growth substrate is thereby prevented from contacting two material interfaces at the same time, such that the removal of the growth substrate may be easily performed. In this way, the light-emitting elements required by the display device may be completed in a single transfer, and the display quality of the display device is therefore improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display device, comprising:
   a circuit substrate;
   a silicon dioxide pattern, located on the circuit substrate, having first openings;
   light-emitting elements, located on the circuit substrate, electrically connected to the circuit substrate, wherein the light-emitting elements are located in the first openings respectively and are adjacent to the silicon dioxide pattern; and
   a release layer, attached to the light-emitting elements and used to facilitate removal of a growth substrate for forming the light-emitting elements, wherein the silicon dioxide pattern and the light-emitting elements are located between the circuit substrate and the release layer, and no intervening element exists between the silicon dioxide pattern and the circuit substrate.

2. The display device according to claim 1, further comprising isolation structures, wherein the release layer is located between the isolation structures and the silicon dioxide pattern.

3. The display device according to claim 2, further comprising a color conversion structure located between the isolation structures.

4. The display device according to claim 1, wherein an area of a top surface and an area of a bottom surface of each of the light-emitting elements are different.

5. A display device, comprising:
   a circuit substrate;
   a silicon dioxide pattern, located on the circuit substrate, having first openings; and
   light-emitting elements, located on the circuit substrate, electrically connected to the circuit substrate, wherein the light-emitting elements are located in the first openings respectively and are adjacent to the silicon dioxide pattern,
   wherein the circuit substrate has recesses, each of which is disposed between two of the light-emitting elements, and the silicon dioxide pattern is located in the recesses.

6. The display device according to claim 1, further comprising a light absorption pattern, wherein the silicon dioxide pattern covers the light absorption pattern.

7. The display device according to claim 1, further comprising a reflective pattern, wherein the silicon dioxide pattern covers the reflective pattern.

8. The display device according to claim 7, wherein a first width of the reflective pattern close to the release layer is less than a second width of the reflective pattern away from the release layer.

9. A manufacturing method of a display device, comprising:
   providing a growth substrate for forming light-emitting elements;
   forming a release layer on the growth substrate;
   forming a silicon dioxide pattern on the release layer, wherein the silicon dioxide pattern has first openings;
   forming the light-emitting elements on the release layer, wherein the light-emitting elements are located in the first openings respectively and are adjacent to the silicon dioxide pattern, and the release layer is attached to the light-emitting elements;
   providing a circuit substrate and setting the light-emitting elements and the circuit substrate to be electrically connected, wherein the silicon dioxide pattern and the light-emitting elements are located on the circuit substrate, the silicon dioxide pattern and the light-emitting elements are located between the circuit substrate and the release layer, and no intervening element exists between the silicon dioxide pattern and the circuit substrate; and
   removing the growth substrate to expose the release layer, wherein the release layer facilitates removal of the growth substrate.

10. The manufacturing method of the display device according to claim 9, further comprising: forming isolation structures on the release layer.

11. The manufacturing method of the display device according to claim 10, further comprising: forming a color conversion structure between the isolation structures.

12. The manufacturing method of the display device according to claim 9, wherein the step of forming the silicon dioxide pattern on the release layer further comprises:
    forming a light absorption pattern on the release layer, wherein the light absorption pattern has second openings; and
    forming the silicon dioxide pattern to cover the light absorption pattern.

13. The manufacturing method of the display device according to claim 9, wherein the step of forming the silicon dioxide pattern on the release layer further comprises:
    forming a reflective pattern on the release layer, wherein the reflective pattern has third openings; and
    forming the silicon dioxide pattern to cover the reflective pattern.

14. The display device according to claim 5, wherein an area of a top surface and an area of a bottom surface of each of the light-emitting elements are different.

15. The display device according to claim 5, wherein an area of a top surface and an area of a bottom surface of the silicon dioxide pattern are different.

16. The display device according to claim 15, wherein the bottom surface of the silicon dioxide pattern is located in the recesses.

17. A display device, comprising:
a circuit substrate;
a silicon dioxide pattern, located on the circuit substrate, having first openings;
light-emitting elements, located on the circuit substrate, electrically connected to the circuit substrate, wherein the light-emitting elements are located in the first openings respectively and are adjacent to the silicon dioxide pattern;
color conversion structures disposed over the light-emitting elements respectively; and
a light absorption pattern or a reflective pattern, a bottom surface of which is covered by the silicon dioxide pattern, wherein the silicon dioxide pattern is disposed between the light absorption pattern and the circuit substrate or between the reflective pattern and the circuit substrate.

18. The display device according to claim 17, wherein the light absorption pattern or the reflective pattern is encircled by the silicon dioxide pattern and the release layer.

19. The display device according to claim 17, wherein the light absorption pattern comprises a black resin or a photoresist.

20. The display device according to claim 17, further comprising isolation structures, each of which is disposed between two of the color conversion structures, wherein the light absorption pattern or the reflective pattern is located between the isolation structures and the silicon dioxide pattern.

\* \* \* \* \*